(12) United States Patent
Jung-Kubiak et al.

(10) Patent No.: US 9,512,863 B2
(45) Date of Patent: Dec. 6, 2016

(54) SILICON ALIGNMENT PINS: AN EASY WAY TO REALIZE A WAFER-TO-WAFER ALIGNMENT

(71) Applicant: CALIFORNIA INSTITUTE OF TECHNOLOGY, Pasadena, CA (US)

(72) Inventors: Cecile Jung-Kubiak, Pasadena, CA (US); Theodore Reck, Pasadena, CA (US); Bertrand Thomas, Bonn (DE); Robert H. Lin, Chino, CA (US); Alejandro Peralta, Huntington Beach, CA (US); John J. Gill, La Crescenta, CA (US); Choonsup Lee, La Palma, CA (US); Jose V. Siles, Pasadena, CA (US); Risaku Toda, Glendale, CA (US); Goutam Chattopadhyay, Pasadena, CA (US); Ken B. Cooper, Glendale, CA (US); Imran Mehdi, South Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 292 days.

(21) Appl. No.: 13/871,830

(22) Filed: Apr. 26, 2013

(65) Prior Publication Data

US 2014/0147192 A1 May 29, 2014

Related U.S. Application Data

(60) Provisional application No. 61/638,939, filed on Apr. 26, 2012, provisional application No. 61/651,940, filed on May 25, 2012.

(51) Int. Cl.
*B25G 3/00* (2006.01)
*F16C 11/06* (2006.01)
(Continued)

(52) U.S. Cl.
CPC .......... *F16B 5/025* (2013.01); *Y10T 29/49778* (2015.01); *Y10T 403/20* (2015.01)

(58) Field of Classification Search
CPC ............... F16C 11/0647; F16C 11/0633; F16C 11/0638; F16C 11/06052; H01R 43/007; H01R 43/2407; H01R 43/2414; Y10T 403/20
(Continued)

(56) References Cited

U.S. PATENT DOCUMENTS 4,580,866 A * 4/1986 Hagner ................ H03H 1/0007
333/181
4,858,313 A * 8/1989 Bowlin .............. H01R 13/6599
29/874

(Continued)

OTHER PUBLICATIONS

Allison, J. et al. "Surface Roughness and Attenuation of Precision-Drawn, Chemically Polished, Electropolished, Electroplated, and Electroformed Waveguides" Proceedings of IEEE—Part B: Radio and Electronic Engineering; Mar. 1955; vol. 102; No. 2; pp. 251-259.

(Continued)

*Primary Examiner* — Gregory Binda
*Assistant Examiner* — Nahid Amiri
(74) *Attorney, Agent, or Firm* — Steinfl & Bruno, LLP

(57) ABSTRACT

A silicon alignment pin is used to align successive layers of components made in semiconductor chips and/or metallic components to make easier the assembly of devices having a layered structure. The pin is made as a compressible structure which can be squeezed to reduce its outer diameter, have one end fit into a corresponding alignment pocket or cavity defined in a layer of material to be assembled into a layered structure, and then allowed to expand to produce an interference fit with the cavity. The other end can then be inserted into a corresponding cavity defined in a surface of (Continued)

a second layer of material that mates with the first layer. The two layers are in registry when the pin is mated to both. Multiple layers can be assembled to create a multilayer structure. Examples of such devices are presented.

11 Claims, 18 Drawing Sheets

(51) Int. Cl.
*F16D 1/00* (2006.01)
*F16G 11/00* (2006.01)
*F16B 5/02* (2006.01)

(58) Field of Classification Search
USPC ............ 403/292, 27; 439/66; 248/74.2, 74.3
See application file for complete search history.

(56) References Cited

U.S. PATENT DOCUMENTS

| | | | | |
|---|---|---|---|---|
| 5,074,779 | A * | 12/1991 | Tsutsumi | B29C 45/40 249/67 |
| 5,815,427 | A * | 9/1998 | Cloud | G11O 5/06 257/706 |
| 5,823,827 | A * | 10/1998 | Belopolsky | H01R 13/6658 439/620.06 |
| 6,712,594 | B2 * | 3/2004 | Saito | B29C 45/14 249/158 |
| 6,724,208 | B2 * | 4/2004 | Matsunaga | G01R 1/06761 324/755.11 |
| 7,183,620 | B2 * | 2/2007 | Kurtz | G01L 19/147 257/415 |
| 7,268,430 | B2 * | 9/2007 | Suga | H01L 21/4846 257/669 |
| 7,284,991 | B2 * | 10/2007 | Noda | H01L 23/49811 439/66 |
| 7,887,899 | B2 * | 2/2011 | Fujita | H01R 13/035 257/E23.067 |
| 8,162,555 | B2 * | 4/2012 | Kim | B41J 2/14 401/222 |
| 8,198,621 | B2 * | 6/2012 | Rogers | B82Y 10/00 257/40 |
| 2009/0321588 | A1 * | 12/2009 | Sullivan | F16L 3/1075 248/74.2 |

OTHER PUBLICATIONS

Appleby, R. et al. "Standoff Detection of Weapons and Contraband in the 100 GHz to 1 THz Region" IEEE Transactions on Antennas and Propagation; Nov. 2007; vol. 55; No. 11; pp. 2944-2956.

Bacher, W. et al. "The LIGA technique and its potential for microsystems-a survey" IEEE Transactions on Industrial Electronics; Oct. 1995; vol. 42; Issue 5; pp. 431-441.

Chattopadhyay, G. et al. "Deep Reactive Ion Etching based silicon micromachined components at terahertz frequencies for space applications" 33rd International Conference on Infrared, Millimeter and Terahertz Waves, Sep. 15-19, 2008; pp. 1-2.

Chattopadhyay, G. et al. "Silicon Micromachined Components at Terahertz Frequencies for Astrophysics and Planetary Applications" International Space Symposium on THz Technologies; Apr. 2008; Groningen, Netherlands; pp. 339-341.

Cullens, E.D. et al. "Micro-Fabricated 130-180 GHz Frequency Scanning Waveguide Arrays" IEEE Transactions on Antennas and Propagation; Aug. 2012; vol. 60; Issue 8; pp. 3647-3653.

Hartogh, P. et al. "Submillimeter Wave Instrument for EJSM" EJSM Instrument Workshop; Jul. 15-17, 2009; Maryland, USA; p. 8. (Total of 48 pages).

Jung, C. et al. "Silicon Micromachining Technology for THz applications" Proceedings of the 35th International Conference on Infrared, Millimeter and Terahertz Waves; Sep. 2010; Rome, Italy; pp. 1-3.

Lubecke, V.M. et al. "Micromachining for terahertz applications" IEEE Transactions on Microwave Theory and Techniques; Nov. 1998; vol. 46; No. 11; pp. 1821-1831.

Nordquist, C. et al. "Design, fabrication, and characterization of metal micromachined rectangular waveguides at 3 THz" IEEE Antennas and Propagation Society International Symposium; Jul. 5-11, 2008; San Diego, CA; pp. 1-4.

Pickett, H.M. et al. "Characterization of a dual mode horn for submillimeter wavelengths" IEEE Transactions on Microwave Theory and Techniques; Aug. 1984; MTT-32; No. 8; pp. 936-937.

Potter, P.D. "A new horn antenna with suppressed sidelobes and equal bandwidths" Microwave Journal; Jun. 1963, No. 8; pp. 71-78.

Shang, X. et al. "Micromachined W-band waveguide and filter with two embedded H-plane bends" IET Microwaves, Antennas & Propagation; Feb. 21, 2011; vol. 5; Issue 3; pp. 334-339.

Siegel, P.H. "Terahertz Technology" IEEE Transactions on Microwave Theory and Techniques; Mar. 2002; vol. 50; No. 3; pp. 910-928.

Smith III, C.H. et al. "Development of a multi-layer Su-8 process for terahertz frequency waveguide blocks" Microwave Symposium Digest, 2005 IEEE MTT-S International; Jun. 12-17, 2005; pp. 439-442.

Stanec, J.R. et al. "Fabrication and Integration of Micromachined Submillimeter-Wave Circuits" IEEE Microwave and Wireless Components Letters; Aug. 2011; vol. 21; Issue 8; pp. 409-411.

Thomas, B. et al. "A 530-600 GHz silicon micro-machined integrated receiver using GaAs MMIC membrane planar Schottky diodes" International Space Symposium on Space THz Technologies; Mar. 23-25, 2010; Oxford, UK; pp. 161-164.

\* cited by examiner

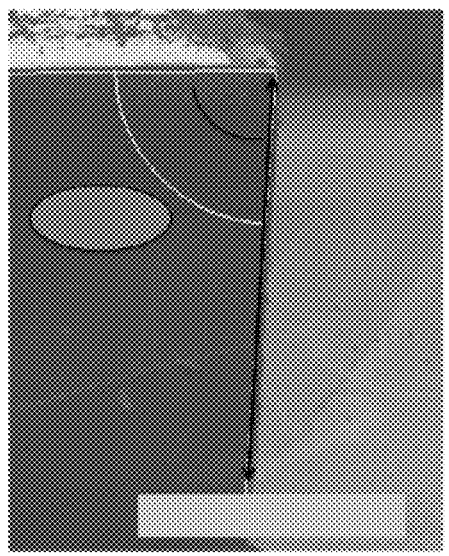
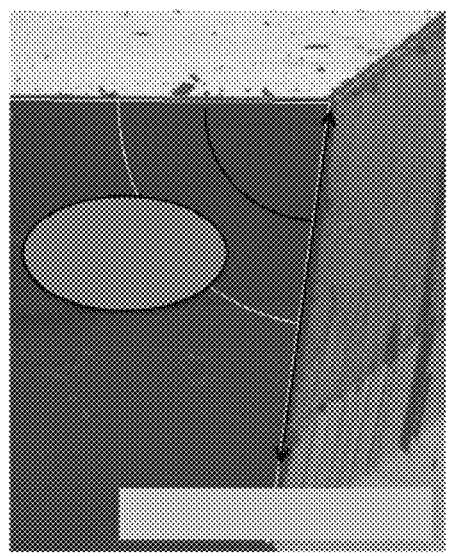
FIG. 5A          FIG. 5B
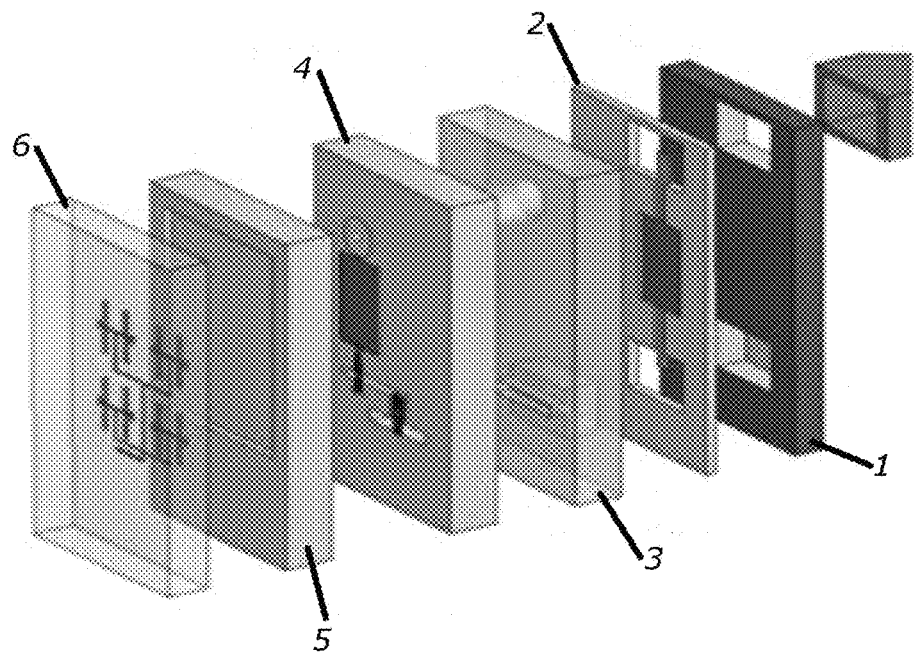
FIG. 7

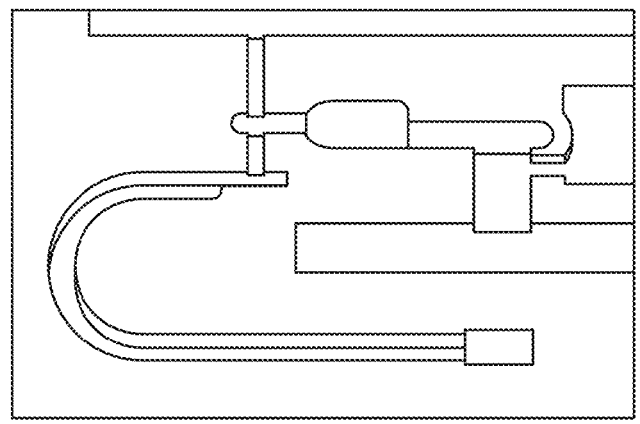
FIG. 9   100 μm
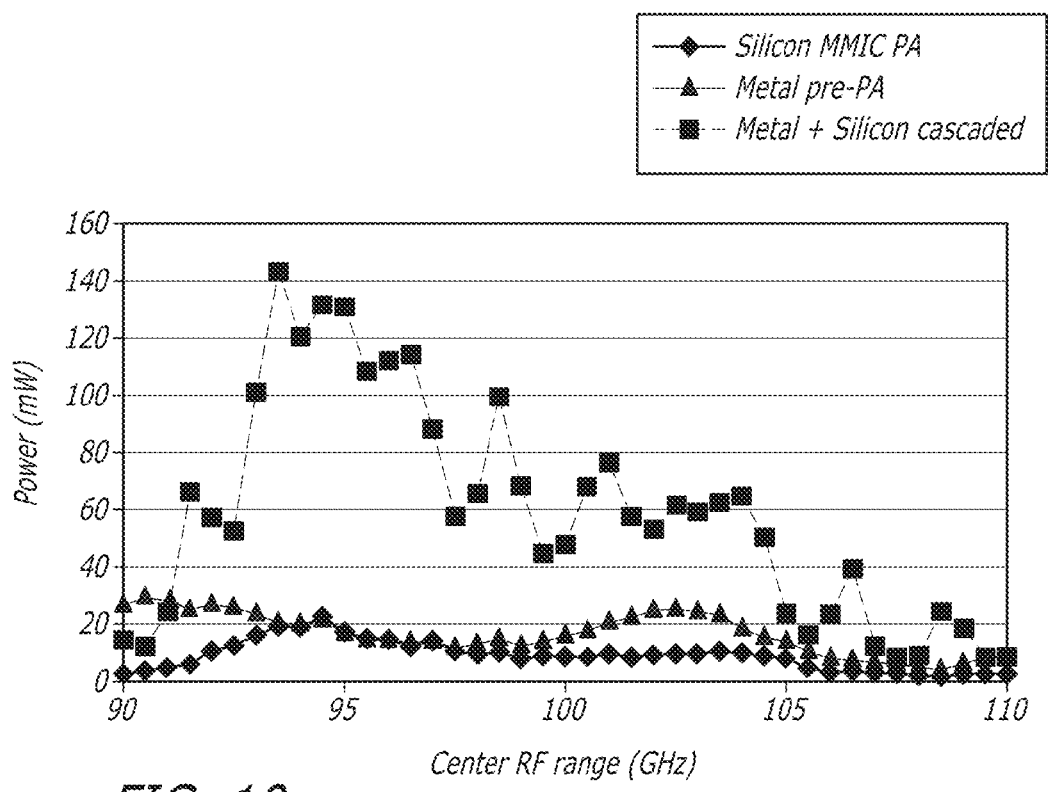
FIG. 10

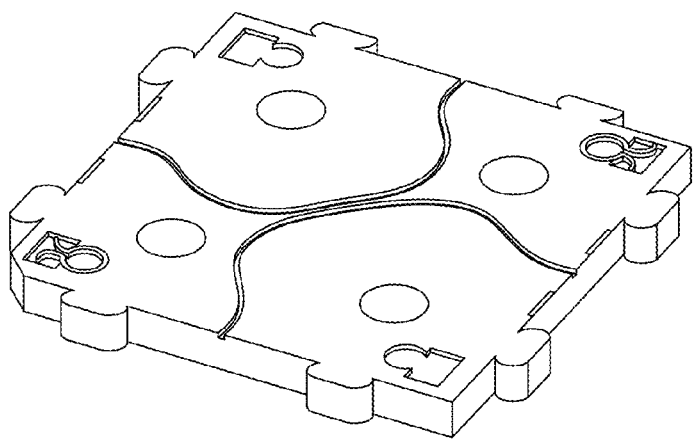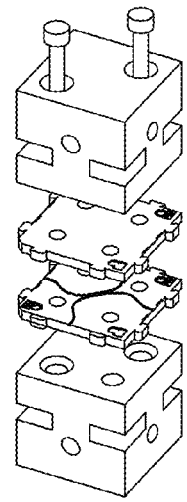
FIG. 15A    FIG. 15B
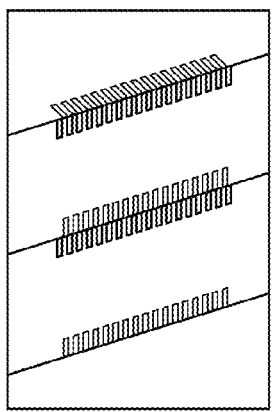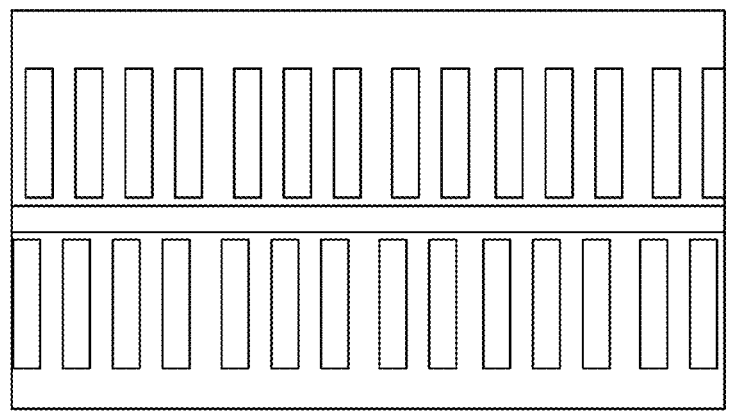
FIG. 17A    FIG. 17B

SILICON ALIGNMENT PINS: AN EASY WAY TO REALIZE A WAFER-TO-WAFER ALIGNMENT

CROSS-REFERENCE TO RELATED APPLICATIONS

This application claims priority to and the benefit of U.S. provisional patent application Ser. No. 61/638,939, filed Apr. 26, 2012, and U.S. provisional patent application Ser. No. 61/651,940, filed May 25, 2012, each of which applications is incorporated herein by reference in its entirety.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

FIELD OF THE INVENTION

The invention relates to semiconductor fabrication methods in general and particularly to methods useful in making submillimeter-wave and terahertz devices.

BACKGROUND OF THE INVENTION

Submillimeter-wave heterodyne receivers are important for a number of applications, from providing quantitative molecular abundance profiles in atmospheres to detecting contra-band. The current generation of receivers relies on metal waveguide blocks made using conventional precision machining tools such as end mills. For real time imaging capabilities and for large fields of view it is highly desirable to have two dimensional detector arrays, and therefore novel approaches to building compact waveguide architectures are needed.

CNC metal machining is a highly refined method capable of producing terahertz circuits, but the cost is high due to the serial nature of the process.

Micromachining of submillimeter-wave and terahertz circuits is a very attractive approach for terahertz waveguide components since it offers the potential for lower cost and better precision fabrication. See, for example, V. Lubecke, K. Mizuno, and G. Rebeiz, "Micromachining for terahertz applications," *Microwave Theory and Techniques, IEEE Transactions on*, vol. 46, no. 11, pp. 1821-1831, November 1998. Micromachining offers the potential for batch fabrication at photolithographic accuracies, thus reducing the cost per component while improving precision and uniformity. This type of fabrication technology could enable the development of multi-pixel terahertz systems and novel components that are not compatible with CNC metal machining.

Several different micromachining techniques exist for fabrication of terahertz circuits. Thick, permanent resist such as SU-8 is used to build waveguide structures and has attracted attention due to the minimal equipment requirements and the high aspect ratio features it can produce. See, for example, X. Shang, M. Ke, Y. Wang, and M. Lancaster, "Micromachined W-band waveguide and filter with two embedded H-plane bends," *Microwaves, Antennas Propagation, IET*, vol. 5, no. 3, pp. 334-339, 21 2011; and C. H. Smith, H. Xu, and N. Barker, "Development of a multi-layer SU-8 process for terahertz frequency waveguide blocks," *Microwave Symposium Digest, 2005 IEEE MTT-S International*, pp. 439-442, June 2005.

LIGA is a German acronym for Lithographie, Galvanoformung, Abformung (Lithography, Electroplating, and Molding) that describes a fabrication technology used to create high-aspect-ratio microstructures. See W. Bacher et al., The LIGA technique and its potential for microsystems—a survey, IEEE Trans. Industrial Electronics, 42, 431-441, October 1995. The LIGA technique offers the possibility to manufacture microstructures with arbitrary lateral geometry, lateral dimensions down to below 1 µm and aspect ratios up to 500 from a variety of materials (metals, plastics, and ceramics). LIGA focuses on thick resists similar to SU-8 as molds for electroplating, and thus can be used to build-up metal waveguides. See, for example, J. Stanec and N. Barker, "Fabrication and integration of micromachined submillimeter-wave circuits," *Microwave and Wireless Components Letters, IEEE*, vol. 21, no. 8, pp. 409-411, August 2011; C. Nordquist, M. Wanke, A. Rowen, C. Arrington, M. Lee, and A. Grine, "Design, fabrication, and characterization of metal micromachined rectangular waveguides at 3 THz," in *Antennas and Propagation Society International Symposium, 2008. AP-S 2008. IEEE*, July 2008, pp. 1-4; and E. Cullens, L. Ranzani, K. Vanhille, E. Grossman, N. Ehsan, and Z. Popovic, "Micro-fabricated 130-180 GHz frequency scanning waveguide arrays," *Antennas and Propagation, IEEE Transactions on*, vol. 60, no. 8, pp. 3647-3653, August 2012.

These resist based technique have some disadvantages. SU-8 processes are very challenging to stabilize and the resist is difficult to deposit uniformly, reducing the precision of each layer thickness or requiring an additional processing step such as lapping. LIGA suffers from similar problems, as electroplating a flat layer of tens to hundreds of microns thick is very difficult, so lapping is also usually required to planarize each layer.

Recent studies have been successful in the fabrication of silicon micromachined components but there is still a lack of effective methods to characterize those circuits. In particular, coupling between the micromachined waveguide and standard metal waveguide flanges suffers from misalignment problems due to the difficulty of aligning to non-metal machined waveguide components.

There is a need for improved methods for fabricating and using submillimeter wave and terahertz devices.

SUMMARY OF THE INVENTION

According to one aspect, the invention features an alignment pin having a first end and a second end. The alignment pin comprises a compressible structure having a central axis, the compressible structure having a arcuate surface having a surface roughness of less than tens of microns disposed about the central axis, the compressible structure having an aperture oriented along the central axis defined within the compressible structure, the compressible structure having two opposed projections each oriented in a direction perpendicular to the central axis, the compressible structure configured to assume a relaxed configuration in which the two opposed projections are spaced apart when no mechanical force is applied to the two opposed projections and the compressible structure is configured to assume a compressed configuration upon the application of a mechanical force to the two opposed projections.

In one embodiment, the compressible structure is made of silicon

In another embodiment, the compressible structure has a length of tens of microns or more measured parallel to the central axis.

In yet another embodiment, the two opposed projections are spaced apart by a distance measured in tens of microns when the mechanical force is not applied to the two opposed projections.

In still another embodiment, the first end and the second end each have a dimension d measured along a line perpendicular to and intersecting the central axis, the line having each of its two ends situated on the arcuate surface when the mechanical force is not applied to the two opposed projections and wherein the first end and the second end each have a dimension c smaller than the dimension d measured along a line perpendicular to and intersecting the central axis and having each of its two ends situated on the arcuate surface upon the application of mechanical force to the two opposed projections.

According to another aspect, the invention relates to a method of aligning two component layers of a multilayer device. The method comprises the steps of providing an alignment pin having a first end and a second end, the alignment pin comprising a compressible structure having a central axis, the compressible structure having a arcuate surface having a surface roughness of less than tens of microns disposed about the central axis, the compressible structure having an aperture oriented along the central axis defined within the compressible structure, the compressible structure having two opposed projections each oriented in a direction perpendicular to the central axis, the compressible structure configured to assume a relaxed configuration when no mechanical force is applied to the two opposed projections wherein the first end and second end each have a dimension d measured along a line perpendicular to and intersecting the central axis, the line having each of its two ends situated on the arcuate surface, and the compressible structure configured to assume a compressed configuration upon the application of a mechanical force to the two opposed projections wherein the first end and second end each have a dimension c smaller than the dimension d measured along the line perpendicular to and intersecting the central axis, the line having each of its two ends situated on the arcuate surface; providing a first layer of a multilayer device, the first layer having a first layer aperture defined in a surface of the first layer, the first layer aperture having a dimension larger than the dimension c and smaller than the dimension d; providing a second layer of the multilayer device, the second layer having a second layer aperture defined in a surface of the second layer, the second layer aperture having a dimension substantially equal to the first layer aperture, the second layer aperture designed to be in registry with the first layer aperture when the first layer and the second layer are aligned; applying mechanical force to the two opposed projections of the compressible structure to provide the compressible structure in the compressed configuration; inserting the first end of the alignment pin in the compressed configuration into the first layer aperture defined in the surface of the first layer; releasing the mechanical force from the two opposed projections of the compressible structure, thereby mating the first end of the alignment pin with the first layer of the multilayer device; and mating the second layer aperture of the second layer of the multilayer device with the second end of the alignment pin, thereby bringing the first layer and the second layer of the multilayer device into alignment.

In one embodiment, the alignment of the first layer of the multilayer device and the second layer of the multilayer device is an alignment to within 5 μm In another embodiment, at least one of one of the first layer of the multilayer device and the second layer of the multilayer device is fabricated from a semiconductor wafer.

In yet another embodiment, at least one of one of the first layer of the multilayer device and the second layer of the multilayer device is fabricated from a metal.

In still another embodiment, the method further comprises the step of securing the first layer of the multilayer device and the second layer of the multilayer device in an assembled state.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 5A is an SEM image of DRIE etched patterns with 5° sidewall vertical angle.

FIG. 5B is an SEM image of DRIE etched patterns with 8° sidewall vertical angle.

FIG. 7 is an exploded view of a stack of silicon wafers comprising a submillimeter-wave receiver front-end.

FIG. 9 is an SEM image of Si-based etched cavities and waveguides fabricated for the 560 GHz Radiometer-On-A-Chip architecture.

FIG. 10 is a graph showing the measured performance as a function of frequency of the 1st and 2nd ROC stages featuring a W-band metal pre-amplifier and silicon-based power amplifier MMICs measured separately and cascaded.

FIG. 15A is a perspective view of the bottom half of the silicon micromachined 3 dB waveguide hybrid coupler.

FIG. 15B is an exploded view of the complete test package.

FIG. 17A is an image of a model showing the vernier on two mating wafers.

FIG. 17B is a photomicrograph taken during an alignment measurement showing 1 μm misalignment.

DETAILED DESCRIPTION

Figure 1A:
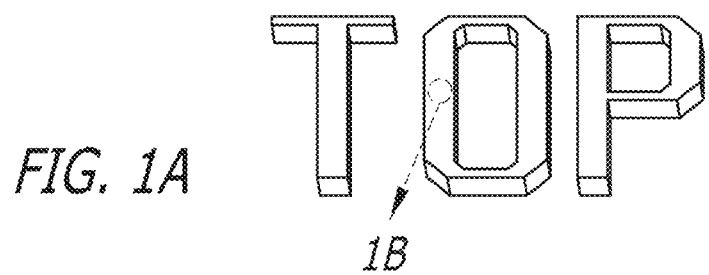
FIG. 1A is an image of a silicon micromachined waveguide.

Advanced semiconductor nanofabrication techniques are utilized to design, fabricate and demonstrate a super-compact, low-mass (<10 grams) submillimeter-wave heterodyne front-end. RF elements such as waveguides and channels are fabricated in a silicon wafer substrate using deep reactive ion etching (DRIE). Etched patterns with sidewalls angles controlled with 1° precision are reported, while maintaining a surface roughness of better than 20 nm rms for the etched structures. This approach is also used to build compact 2-D imaging arrays in the THz frequency range.

In another example, the techniques are used to assemble and measure micromachined submillimeter-wave waveguide circuits operating from 500 to 750 GHz. A novel micromechanical compression pin (or alignment pin) has been developed to improve wafer-to-wafer alignment to less than 1 μm. Connection between the silicon waveguide and a VNA is aligned through a silicon boss that inserts into the custom waveguide flange. Waveguide loss is characterized for both E and H-plane split waveguides and is found to be similar to standard metal waveguides. Measurement of a 3 dB hybrid coupler operating from 500 to 600 GHz is also described.

EXAMPLE 1

A Compact 530-590 GHz Receiver Front-End in an all-Silicon Waveguide Structure

We demonstrate the use of advanced semiconductor nanofabrication technologies to build a compact 530-590 GHz receiver front-end in an all-silicon waveguide structure. The receiver block comprises a stack of precisely etched silicon wafers aligned to one another using silicon pins. The wafers are processed using deep reactive ion etching (DRIE) techniques to form channels for mounting low parasitic GaAs Schottky diode chips and custom waveguide matching circuits for coupling THz power both laterally and vertically with low return loss. We also describe the ability to etch silicon waveguides with precisely controlled vertical angles, which may enable the integration of high-performance all-silicon conical beam horns for coupling energy to and from free space.

Micromachining of Silicon

The utilization of micromachined silicon for THz circuits places a number of important constraints on the structures. First, THz frequency waveguides and device channels need very smooth sidewalls and bottom surfaces in order to minimize ohmic losses. The cross sections of the waveguide walls also have to be precisely rectangular in order to minimize scattering from geometric inhomogeneities and integrate MMIC amplifiers, multipliers, and mixers successfully. Finally, a robust and accurate alignment scheme is needed to assure good impedance matching across vertical wafer-to-wafer waveguide transitions.

Silicon wafers are processed with conventional UV lithography, and Deep Reactive Ion Etching (DRIE) techniques using thick AZ9260 resist as etching mask. The DRIE technique used is the well-known Bosch process based on the alternative exposures to $SF_6$ and $C_4F_8$ gases. With optimized plasma power and etching gas ratios, we can achieve a selectivity of 50:1 for etching at low rates (2 μm/min) and up to 75:1 for long and deep etches (4 μm/min). The second recipe is mainly used for etch-through waveguide openings where 1 mm of silicon is etched with a 15 μm resist mask and where sidewalls and bottom surfaces roughnesses are less critical.

Etched Pattern Surface Roughness

To avoid losses during signal transmission, it is advantageous that the DRIE waveguide structures have a surface roughness of less than 50 nm. With these smooth surfaces, the excess attenuation coming from the surface roughness is expected to be negligible compared to the total ohmic losses. As shown in FIG. 1, our optimized DRIE process can achieve an 18 nm rms surface roughness on the bottom of a 280×280×40 μm waveguide channel etched in a 500 μm thick silicon wafer.

Figure 1B:
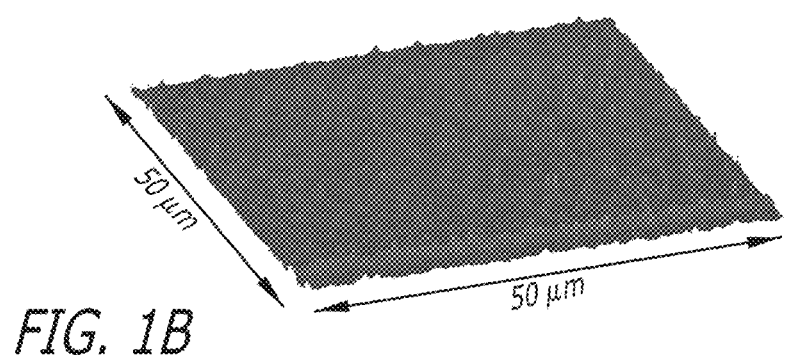
FIG. 1B depicts the results of an AFM measurement on a portion of the surface of the silicon micromachined waveguide shown in FIG. 1A and indicates that 18 nm rms surface roughness can be achieved.

During the DRIE Bosch process, the $SF_6$ is used to etch the silicon, while the $C_4F_8$ passivates the etched surfaces. This alternation of etching and passivation steps results in anisotropic etch of the silicon and it can introduce unwanted modulation in the sidewall profile. With the control of the gas flows and pressures, this scalloping effect can be significantly reduced. To achieve the small levels of surface roughness shown in FIG. 1A and FIG. 1B, a specific etching recipe was developed with a ramp up of the plasma power during the etch cycle, instead of keeping it constant. FIG. 1A is an image of a silicon micromachined waveguide. FIG. 1B depicts the results of an AFM measurement on a portion of the surface of the silicon micromachined waveguide shown in FIG. 1A and indicates that 18 nm rms surface roughness can be achieved.

Figure 2A:
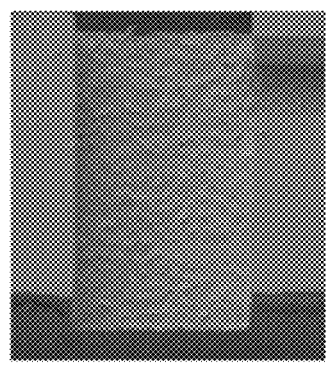
FIG. 2A is an image of an etched waveguide structure produced using fixed plasma power.
Figure 2B:
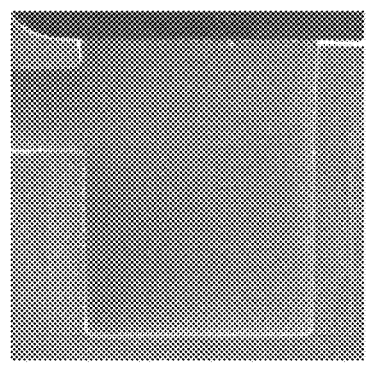
FIG. 2B is an image of an etched waveguide structure produced using power increase (ramping up) during etching, which results in better surface quality of the waveguide structures as compared to the results shown in FIG. 2A.

FIG. 2A and FIG. 2B compare two similar waveguides, both 500 µm×300 µm and 100 µm deep. FIG. 2A is an image of an etched waveguide structure produced using fixed plasma power. FIG. 2B is an image of an etched waveguide structure produced using power increase (ramping up) during etching, which results in better surface quality of the waveguide structures as compared to the results shown in FIG. 2A.

Sidewall Smoothness and Verticality

Figure 3:
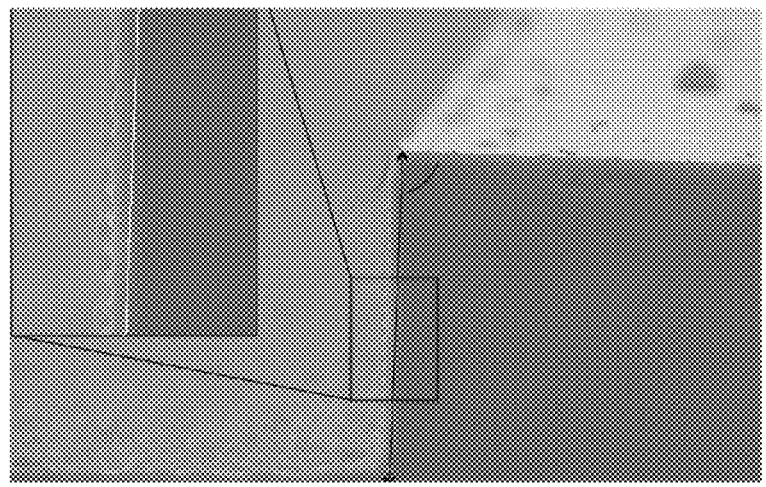
FIG. 3 is an SEM image of an etch pattern with the Bosch effect on the sidewall, where scalloping is visible.
Figure 4:
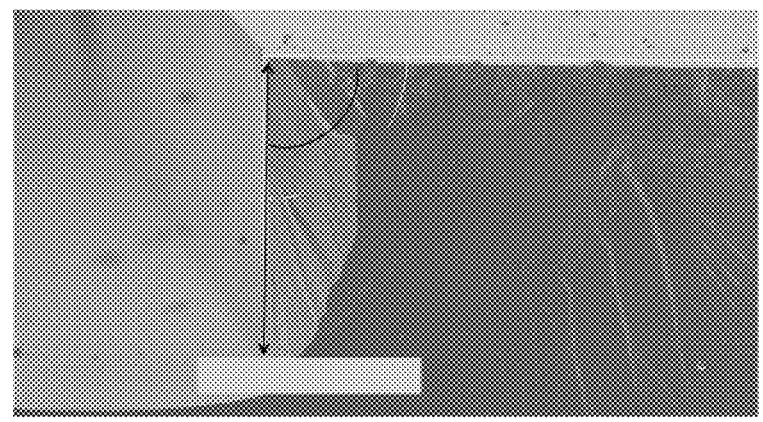
FIG. 4 is an SEM image showing the improvement of the sidewall smoothness and angle by modifying the etching and passivation step duty cycles.

In addition to having small surface roughness, the etched sidewalls must be perpendicular to the top surface with a maximum error of 1°. This is to ensure two important criteria: first, pattern size variations will affect the characteristic impedance, and second, accurate alignment between wafers depends on the high tolerances of the dowel pin/hole mating structures we use. FIG. 3 and FIG. 4 show how changing the ratio of "etching" versus "passivation" can improve the sidewall quality. FIG. 3 is an SEM image of an etch pattern with the Bosch effect on the sidewall, where scalloping is visible. FIG. 4 is an SEM image showing the improvement of the sidewall smoothness and angle by modifying the etching and passivation step duty cycles.

While vertical sidewall profiles are important for waveguides, some RF structures such as horns need sidewalls with controlled slopes. For example, submillimeter-wave Pickett-Potter feed horns are widely used for submillimeter wave components. The typical Pickett horn has a slope of 13.5° but this angle can be reduced to 5°, if the total height of the horn is redesigned to control the sidelobes of the propagation modes. FIG. 5A and FIG. 5B show two SEM images of DRIE patterns with intentionally angled sidewalls of 5° and 8° from normal. Theses angles can be obtained by addition of power ramps and various cycle times of etching and passivation steps.

Precise Wafer-to-Wafer Alignment

Figure 6:
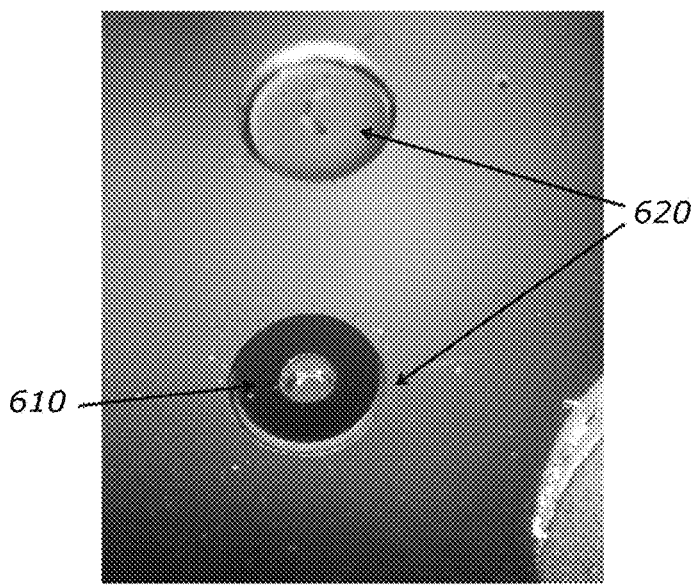
FIG. 6 illustrates a silicon donut 610 and etched pockets 620 which together are used to achieve precise wafer-to-wafer alignment in one embodiment.
Figure 13:
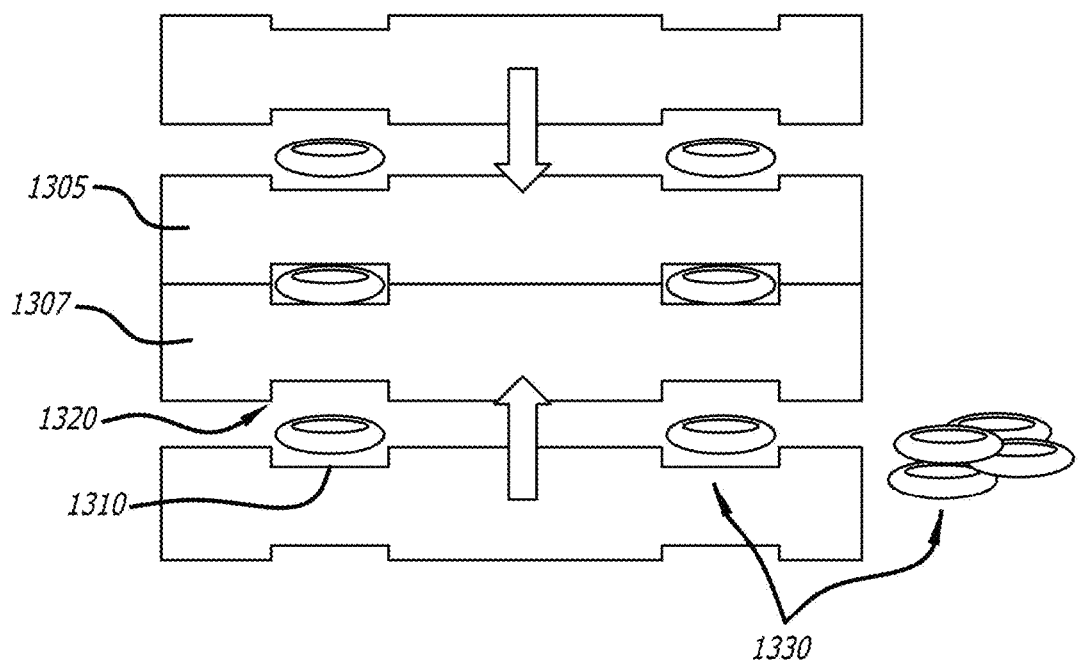
FIG. 13 illustrates assembled layers 1305, 1307 with circular cavities 1310, 1320 and donuts 1330.

A technique using circular etched pockets and silicon donut-shaped dowel pins has also been developed to align two wafers together. The donut shape was selected to prevent trapped air under the silicon pin during the assembly and to make it easier to handle with tweezers. FIG. 6 illustrates a silicon donut 610 and etched pockets 620 which together are used to achieve precise wafer-to-wafer alignment in one embodiment. With this technique, we can achieve a 5 µm alignment or better. In other embodiments, the silicon pins described hereinafter can be used to effect the alignment between the various layers.

560 GHz Radiometer-on-a-Chip

Utilizing the silicon nanofabrication techniques discussed above, a super-compact 560 GHz receiver front-end has been designed, fabricated and tested. FIG. 7 is an exploded view of a stack of silicon wafers comprising a submillimeter-wave receiver front-end. As shown in FIG. 7, the structure includes a plurality of layers including heat sink 1, power amplifier (PA) 2, interface layer 3, submillimeter receiver 4, spacer layer 5, and antenna 6. Each layer is individually fabricated and the stack is then assembled by fitting and aligning each respective layer to its neighbor or neighbors. The LO signal from the input waveguide is amplified, multiplied and mixed with the RF signal from the antenna.

Figure 8:
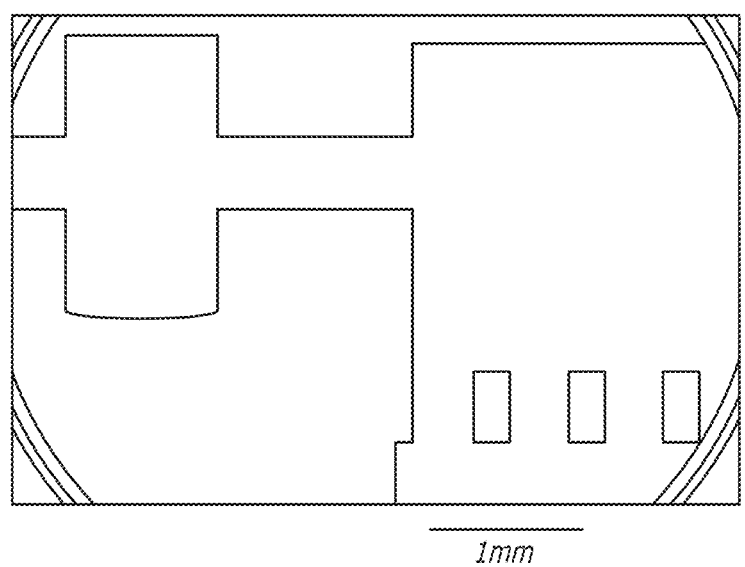
FIG. 8 is an SEM image of a Si-based W-band amplifier, showing a double-step etch 280 μm-115 μm.

The first and second stages of this receiver-on-a-chip (ROC) feature a W-band power amplifier (PA) MMIC packaged in a silicon micro-machined block. The transitions are chosen to have the input/output waveguide interfaces with external waveguides on the flat surface of the wafers. FIG. 8 is an SEM image of a Si-based W-band amplifier, showing a double-step etch 280 µm-115 µm.

The third and fourth stages of the ROC feature an integrated 265-300 GHz tripler and 530-600 GHz subharmonic mixer using MMIC planar Schottky diode devices. These two stages require 4 silicon pieces and nine DRIE etches with depths ranging from 20 µm to 750 µm (etchthrough). FIG. 9 is an SEM image of Si-based etched cavities and waveguides fabricated for stages 3 and 4 of the 560 GHz Radiometer-On-A-Chip architecture. These silicon pieces were fabricated before those presented previously, and therefore the bottom of the etched patterns is very rough.

Measurement Apparatus and Results

The first and second stages of the ROC were tested first in order to measure the amount of output power available at W-band to pump the following stages. FIG. 10 is a graph showing the measured performance as a function of frequency of the 1st and 2nd ROC stages featuring a W-band metal pre-amplifier and silicon-based power amplifier MMICs measured separately and cascaded. Using a conventional metal machining pre-amplifier cascaded with a silicon packaged MMIC power amplifier, an output power of 40-140 mW was measured between 92 and 104 GHz.

Figure 11:
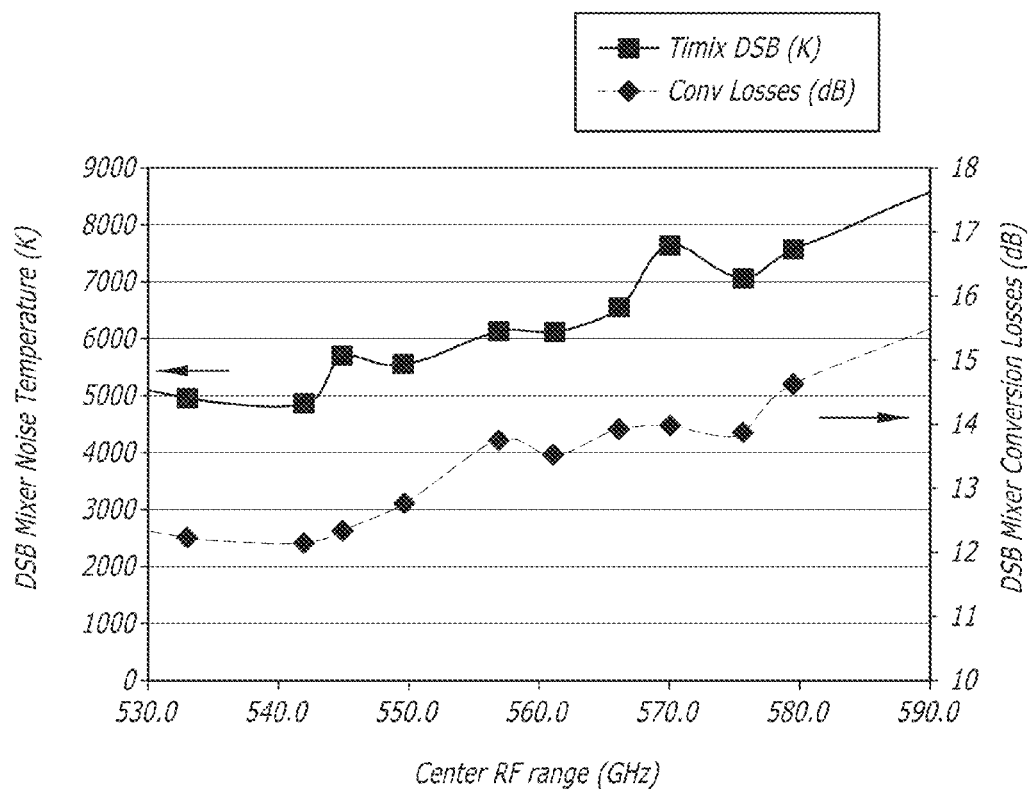
FIG. 11 is a graph showing the measured performance of the 3rd and 4$^{th}$ ROC stages showing the DSB mixer conversion losses and noise temperature vs. central RF range.

The third and fourth stages of the ROC have been tested using a fundamental LO source consisting of an Agilent E8257D synthesizer, an Agilent 83558A W-band source, a W-band pre-amplifier stage and a W-band rotary vane attenuator. As shown in FIG. 11, preliminary results give a DSB mixer noise temperature of 4860 K and DSB mixer conversion losses of 12.1 dB at 540 GHz. FIG. 11 is a graph showing the measured performance of the 3rd and $4^{th}$ ROC stages showing the DSB mixer conversion losses and noise temperature vs. central RF range.

Simulated results with a 20 nm rms surface roughness suggest that the mixer performance should be better by about 3 dB. However, as mentioned before, the silicon pieces used for these measurements were very rough, so we can in part attribute these worse than expected results to that high surface roughness. Nonetheless, the receiver performance of FIG. 11 provides proof of concept that nanofabrication technologies can be utilized to make compact and low-mass submillimeter wave receiver front ends.

Figure 12:
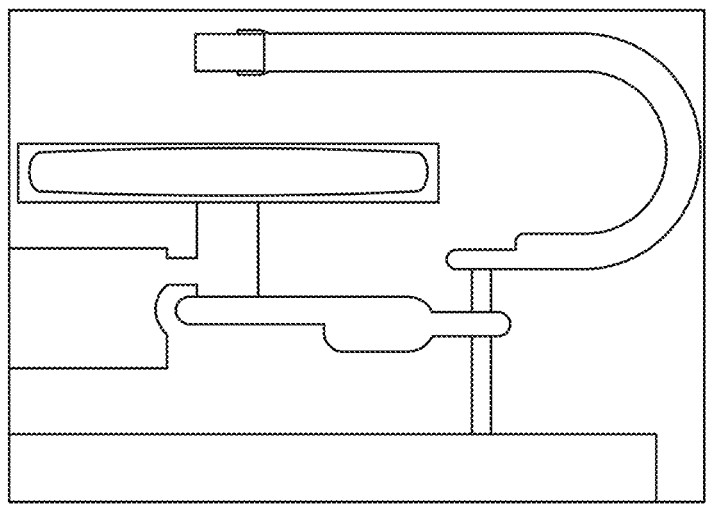
FIG. 12 is an SEM image of improved Si-etched cavities and waveguides for the 560 GHz Radiometer-On-A-Chip architecture.
Figure 14:
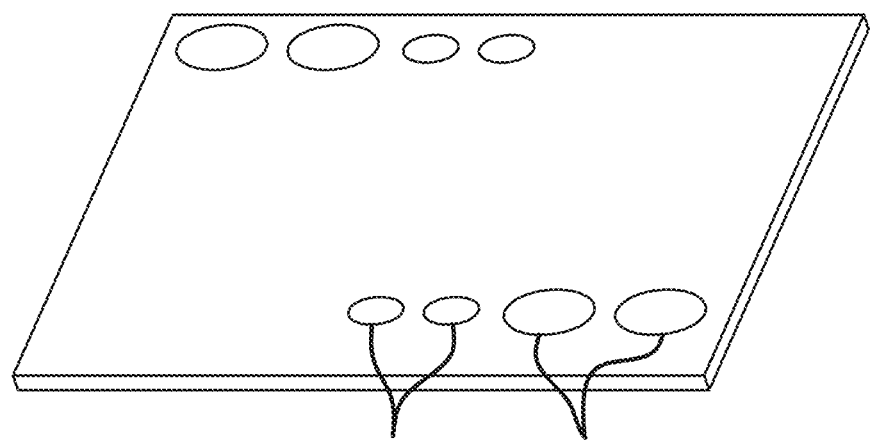
FIG. 14 illustrates cavities 1410, 1420 having a range of diameters.

Other silicon waveguide structures have been fabricated using the DRIE recipes reported hereinabove. In the SEM image shown in FIG. 12, etched cavities and waveguides have the 18 nm rms smooth surface similar to that illustrated in FIG. 1B. This technique provides the flexibility of building a radiometer-on-a-chip and is expected to be useful in fabricating large format array receivers, multi-frequency imaging arrays, and beam-steering capabilities for heterodyne array receivers.

EXAMPLE 2

Silicon Micromachined Waveguide Components

The process adopted in this example is silicon DRIE. Many of the problems mentioned above such as control of the etch angle and etch depth have be overcome by extensive process development. In addition, by having the bulk of the packaging in a high-resistivity material, DC biasing circuitry and thru-wafer vias can be directly integrated to increase circuit density and reduce assembly time.

A new flange alignment scheme enabling repeatable connection to metal waveguide components is described and test results are presented.

We also describe a novel technique for a precise and controllable alignment between each silicon wafer. As the frequency of operation increases, the alignment tolerance between the split-waveguide structures rapidly decreases for devices such as mixers, multipliers and complex passive structures like orthogonal mode transducers. Since silicon micromachined components cannot rely on press-fit alignment pins that are used to align metal waveguide blocks, a new alignment approach based on micromachined silicon compression pins is described.

We present results of the measurement of passive silicon micromachining waveguide components operating in the WR-1.5 band (500 to 750 GHz). Through lines are first tested to characterize the micromachined waveguide and the waveguide loss is similar to that of metal machined waveguides, and measurement of the 3 dB quadrature hybrid coupler shown in FIG. 15A and FIG. 15B is presented. FIG. 15A is a perspective view of the bottom half of the silicon micromachined 3 dB waveguide hybrid coupler. FIG. 15B is an exploded view of the complete test package.

Fabrication

The micromachined components are fabricated from a 100 mm diameter, 1 mm thick low-resistivity silicon wafer. A combination of photoresist masks and thermal oxide masks are used to etch the patterns in DRIE. A detailed characterization of the silicon etch process has been presented hereinabove. Once the desired number of etches has been performed to create the desired depth of the structure, the component are released by etching from back of the wafer. 2 µm of gold is finally deposited by sputtering.

Wafer Alignment and Silicon Compression Pins

An important aspect of the operation of split-waveguide circuits is accurate alignment between the two halves. Metal waveguide blocks can use press-fit pins to achieve very high precision placement of alignment pins to the milled features. Silicon is too brittle for such an approach. In addition, when the two halves are mated, the metal of block might be scratched or dented by an error in position of the alignment pin but silicon will crack, often destroying the wafer.

To align the wafers, silicon pegs are initially used to align pockets that were etched into each half of the circuit. This technique requires the pin diameter to be several microns smaller than the pocket so that the pin does not damage the wafer when inserted and aligned. This inaccuracy (or "slop") results in a measured alignment precision of ±6 µm. Tighter fitting pins can improve the alignment precision, but their use dramatically increases the assembly time and the risk of damage to the micromachined package.

Since the primary source of misalignment when using the static silicon pegs is the slop required to insert the pin into the pocket, a compliant silicon pin has developed.

Figure 16A:
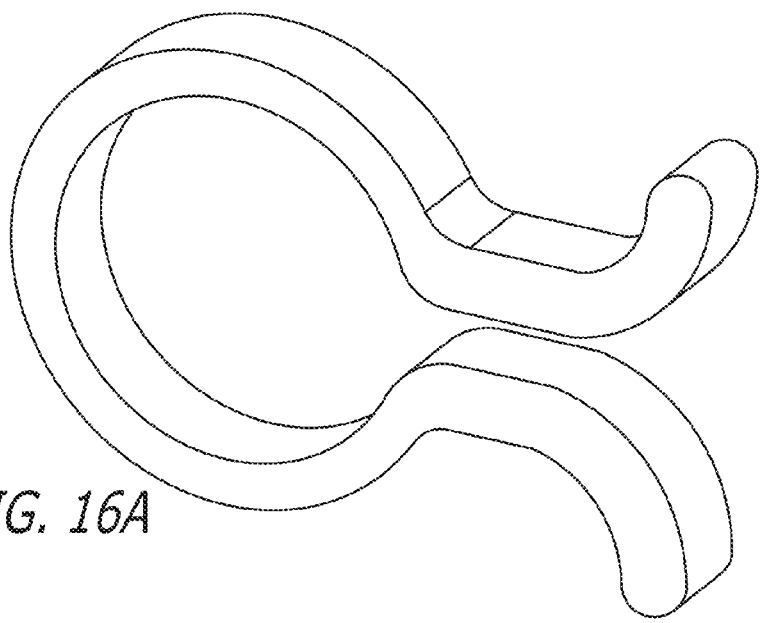
FIG. 16A is a diagram of the silicon compression pin, showing the relevant dimensions of one embodiment.
Figure 16B:
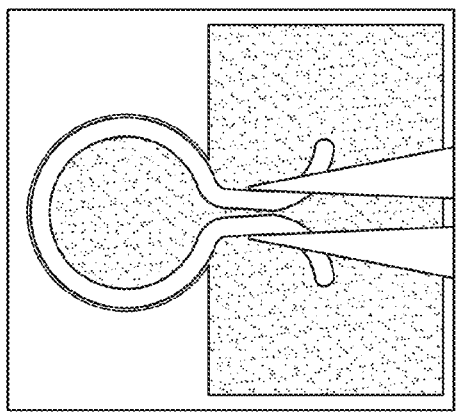
FIG. 16B is an image of the compression pin during assembly as it is squeezed by the tweezers to insert it into the alignment pocket or cavity.
Figure 16C:
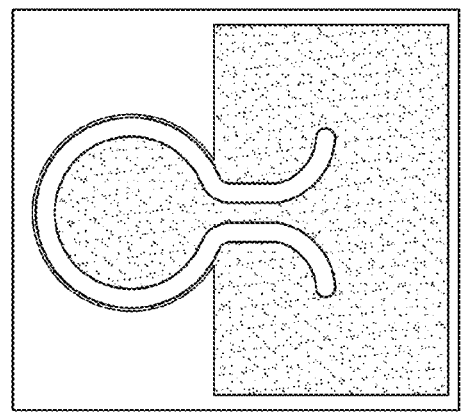
FIG. 16C is an image of the compression pin after it has been released into the alignment pocket or cavity.

FIG. 16A is a diagram of the silicon compression pin, showing the relevant dimensions of one embodiment. In various embodiments, the distance between the two projections that are squeezed can be any convenient distance, for example some tens of microns (25 µm, 50 µm, 75 µm, and up to a few hundred microns, such as 100 µm, 125 µm, 150 µm, 200 µm). In the structure shown in FIG. 16A, the outer surface of the silicon alignment pin is circular, but it is believed that any convenient arcuate shape could also be used. FIG. 16B is an image of the compression pin during assembly as it is squeezed by the tweezers to insert it into the alignment pocket or cavity. When released, the pin expands to fill the pocket. A tight fit is ensured by choosing the relaxed pin diameter (or relaxed dimension), d, to be greater than the pocket diameter. FIG. 16C is an image of the compression pin after it has been released into the alignment pocket or cavity. It is recognized that in a compressed state, as when the silicon alignment pin is in contact with the alignment pocket or cavity defined in a layer to be aligned, the outer surface of the silicon alignment pin may no longer be circular in shape, but rather curvilinear or arcuate.

The spring constant of the pin is controlled by the thickness of the ring, t, and must be designed to allow sufficient compression during assembly while generating as much force as possible to preserve the alignment between the two wafers.

The package is assembled by mounting two compression pins in the bottom half of the package. The top half of the package is then placed on the bottom wafer and is gently slid in small circles to align the top wafer's pockets with the compression pins. At this point a gentle force is applied and a tiny 'click' can be heard when the two wafers come into place. The two wafers are then screwed between two metal blocks which compress the wafers together and provide screw-holes for attaching to waveguide flanges, as shown in FIG. 15.

A study of different spring thicknesses (t) and relaxed diameters (d) was conducted to find an optimum design. The alignment precision of each pin design is characterized by measuring the misalignment on four sides of an assembled package 3 times. The positional and angular offsets are then calculated based on the dimensions of the package. Table I shows the different spring thickness and relaxed diameters tested. Positional offsets were all under 2 µm and the angular offsets were all less than 0.06°. This study found a spring thickness of 100 µm and diameter of 1.025 mm provided the lowest positional offset.

Springs thicker than 100 µm break before they could be compressed into the alignment pocket. The thinnest compression pins failed to produce enough force to maintain the alignment so that when the screws that hold the assembly together are tightened the two wafers twist out of alignment. In an alternative embodiment, if the silicon pins are aligned on the through holes in the wafers, a rod that fit inside the pins after the compressive force is released could be used to hold the assembly together, because the rods would eliminate the possibility that the silicon pins could be compressed.

TABLE I

| t (µm) | d (mm) | Average Positional Offset (µm) |
|---|---|---|
| 40 | 1.020 | 1.77 |
| 80 | 1.020 | 0.70 |
| 80 | 1.025 | 0.77 |
| 80 | 1.030 | 0.38 |
| 100 | 1.020 | 0.35 |
| 100 | 1.025 | 0.24 |
| 100 | 1.030 | 1.17 |

Before different alignment techniques can be compared, a method for measuring the misalignment between wafers is needed. This is done by etching a vernier scale into each half of the component, shown in FIG. 17A. This scale measures the alignment between the two sets of marks by offsetting the spacing of each mark by a known. When two teeth are lined up, one has an indication of the amount of misalignment. This allows rapid evaluation of the misalignment without the need for a calibrated microscope. Precision is limited by the offset distance between each tooth. The 1 μm resolution used in this work proved to be sufficient. The test alignment between two wafers in FIG. 17B, indicates that the misalignment between the two halves is less than 2 μm.

Measurement System and Interfacing to Metal Waveguide Components

The micromachined components are characterized using an Agilent PNA-X network analyzer with VDI WR-1.5 extension heads measuring from 500 to 750 GHz. All measurements are calibrated to the waveguide flange with a TRL calibration kit provided with the extension heads.

Coupling the micromachined components to metal waveguide presents a difficult challenge and has limited the development of micromachined components for many years. Recently, an effective approach has emerged that couples perpendicularly to the split-waveguide plane so that a UG-386 flange can be patterned into the micromachined structure. While this approach enables alignment to the waveguide with the flange's alignment pins, it relies on a waveguide bend at the input and output ports, introducing uncertainty into the measurement. In addition, the area consumed by the UG-386 alignment pin-hole pattern is large compared to the size of the components testing, so significant wafer area is wasted.

Figure 18B:
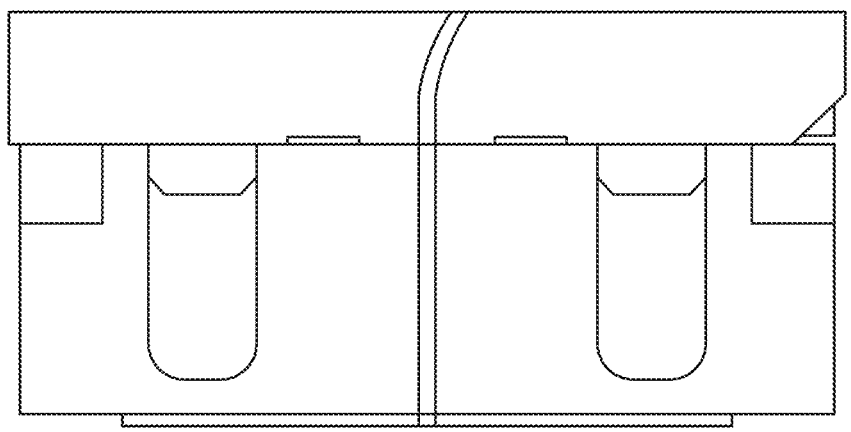
FIG. 18B is a closeup of the test apparatus showing the E-plane cross-section and illustrating the alignment of the silicon bosses to the metal alignment pockets.
Figure 18A:
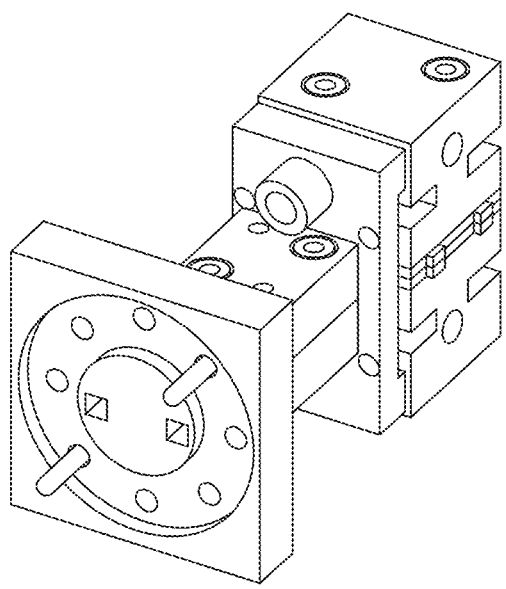
FIG. 18A is a perspective drawing of an assembled test apparatus showing the mating of the metal waveguide fixture to the silicon waveguide.

FIG. 18A is a perspective drawing of an assembled test apparatus showing the mating of the metal waveguide fixture to the silicon waveguide.

FIG. 18B is a closeup of the test apparatus showing the E-plane cross-section and illustrating the alignment of the silicon bosses to the metal alignment pockets.

Figure 18C:
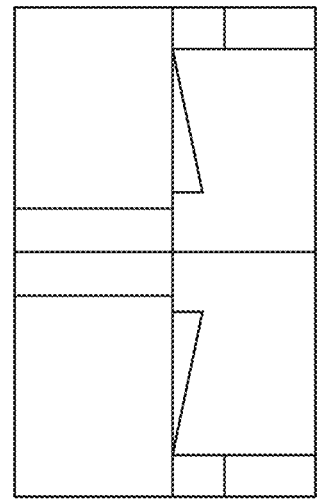
FIG. 18C is a closeup of the test apparatus showing the H-plane cross section and illustrating the etch angle of the backside silicon etch.

FIG. 18C is a closeup of the test apparatus showing the H-plane cross section and illustrating the etch angle of the backside silicon etch.

All these issues can be avoided by measuring from the edge of the wafer as shown in FIG. 18A, but this approach has its own problems. First, the edge of the wafer, which is defined by the etch process, is not flat. Second, there is no area for the UG-386 flange alignment pins to mate, so some other alignment feature is required.

The latter problem is addressed by tight control over the etch angle defining the front edge of the wafer. This etch is more shallow on the waveguide side of the wafer so a slower etch process can be used that has a smaller etch angle. The bulk of the wafer is then etched from the backside with a faster etch rate process. This faster process suffers from a higher etch angle process, but this is not a concern since the waveguides are not interfacing in this region. The etch angles for the front and back sides of the tested devices are 2° and 5°, respectively. A cross section showing the profile of these etches is shown in FIG. 18C.

The alignment of the silicon pieces to the metal waveguide is accomplished by bosses etched on the edge of the wafer that insert into pockets milled on custom waveguide flanges. FIG. 18A shows the flange design with the mating silicon component. Alignment in the waveguide plane is accomplished by the width of the etched silicon bosses. The out of plane alignment is accomplished by the thickness of the silicon.

Both of these alignment features are controlled within ±5 um which results in an overall alignment tolerance of ±7 um. This is slightly better than the tolerances held by the machining of the flange alignment slip-fit pin holes of ±8 um and is more than sufficient for these frequencies. The primary drawback to this approach is that the custom flange is only compatible with a single wafer thickness.

Thru-Line Measurements

Figure 19A:
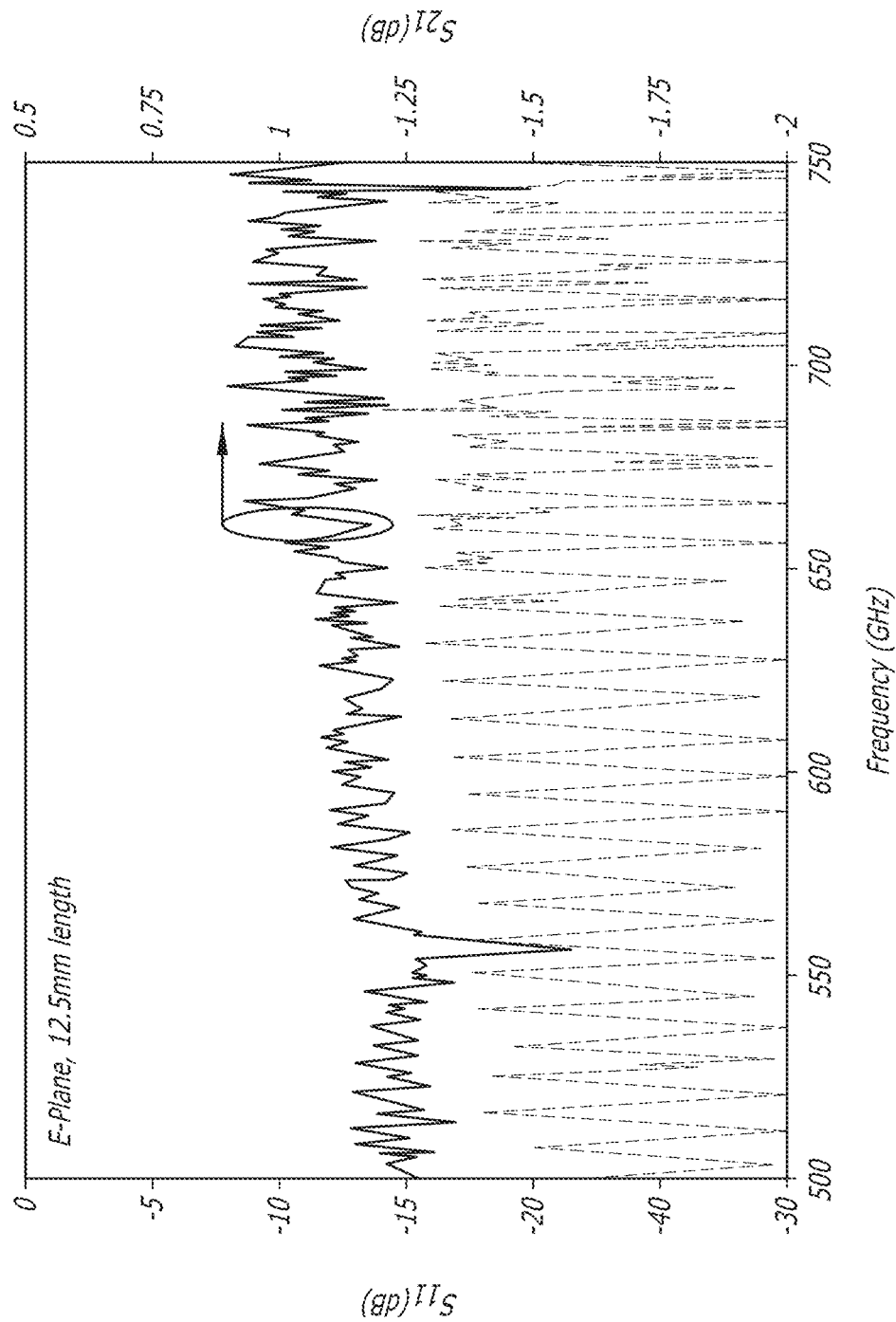
FIG. 19A is a graph showing a measurement of $s_{11}$ vs frequency for the E-plane of the waveguide.
Figure 19B:
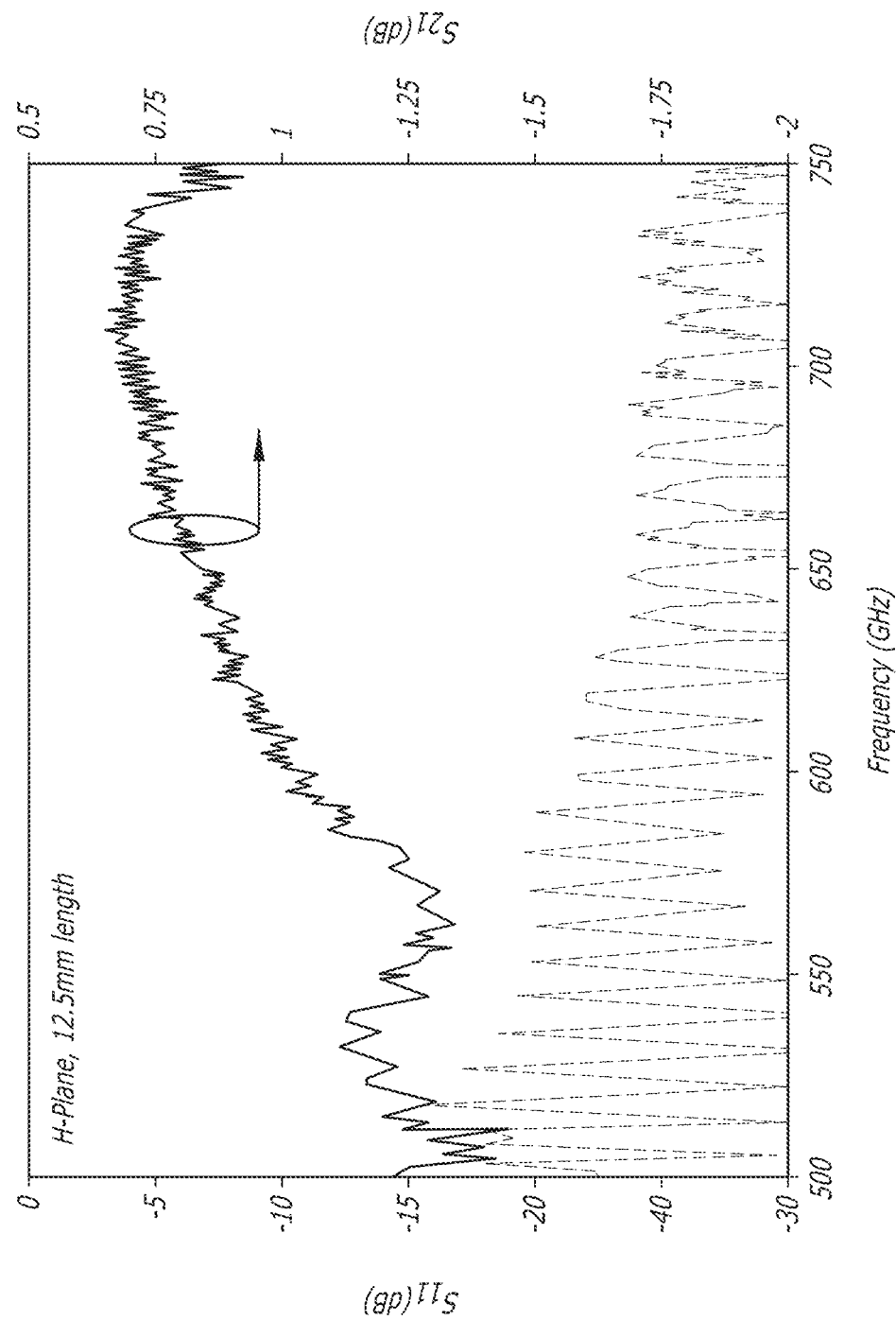
FIG. 19B is a graph showing a measurement of $s_{11}$ vs frequency for the H-plane of the waveguide.
Figure 19C:
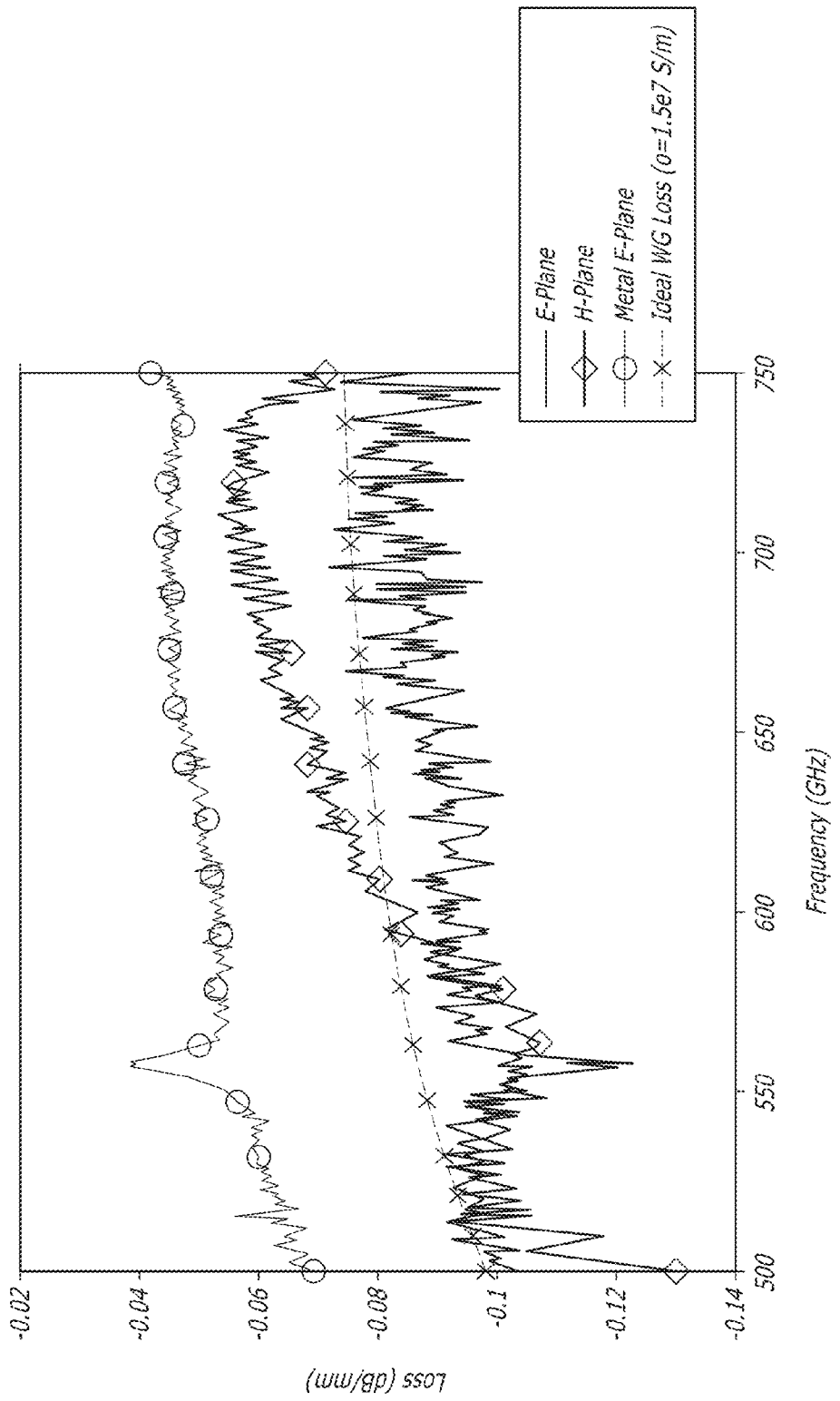
FIG. 19C is a graph showing the measured waveguide loss per millimeter of the E and H-plane split silicon waveguides.

Thru lines are fabricated to characterize the waveguide loss and the repeatability of the alignment scheme. Both E and H-plane split waveguides are tested since H-plane waveguide are better indicators of the gap between the two waveguides halves. FIG. 19A is a graph showing a measurement of $s_{11}$ vs frequency for the E-plane of the 12.5 mm long split waveguide. FIG. 19B is a graph showing a measurement of $s_{11}$ vs frequency for the H-plane of the 12.5 mm long split waveguide. FIG. 19C is a graph showing the measured waveguide loss per millimeter of the E and H-plane split silicon waveguides. The measured loss of a metal machined waveguide and the ideal waveguide loss are included for comparision. The irregularities around 556 GHz are due to the $H_2O$ absorbtion line.

The effect of the gap at the flange interface created by the etch angle is seen as a ripple in the return loss of the thru waveguide measurements. The E-plane waveguide is more affected since the broad-wall is oriented along the etch direction, resulting in a larger gap at the narrow-wall due to the etch angle. The H-plane waveguide has less of a gap, since the etch depth is half as much as the E-plane guide.

The behavior of the return loss across the frequency band is a result of the gap either being on the narrow or broad-wall of the guide. The gap is on the narrow walls of the E-plane split waveguide which can be approximated as a shunt capacitance. For the H-plane waveguide the gap in the broad-wall presents as a series capacitance.

FIG. 19C compares the insertion loss per millimeter through the silicon micromachined waveguides to a metal machined waveguide and the calculated ideal waveguide loss with a conductivity of 1.5e7. Remarkably, the H-plane waveguide performs just as well if not better than the E-plane guide, indicating that there is very little gap between waveguide halves. The H-plane waveguide performing better than the E-plane guide in the upper half of the band is a result of the bottom surface of the waveguide etch having a lower roughness than the sidewalls. The RMS roughness of the bottom surface of the etch is measured to be 20 nm, whereas the sidewall is measured to be 110 nm.

Flange Repeatability

Figure 20:
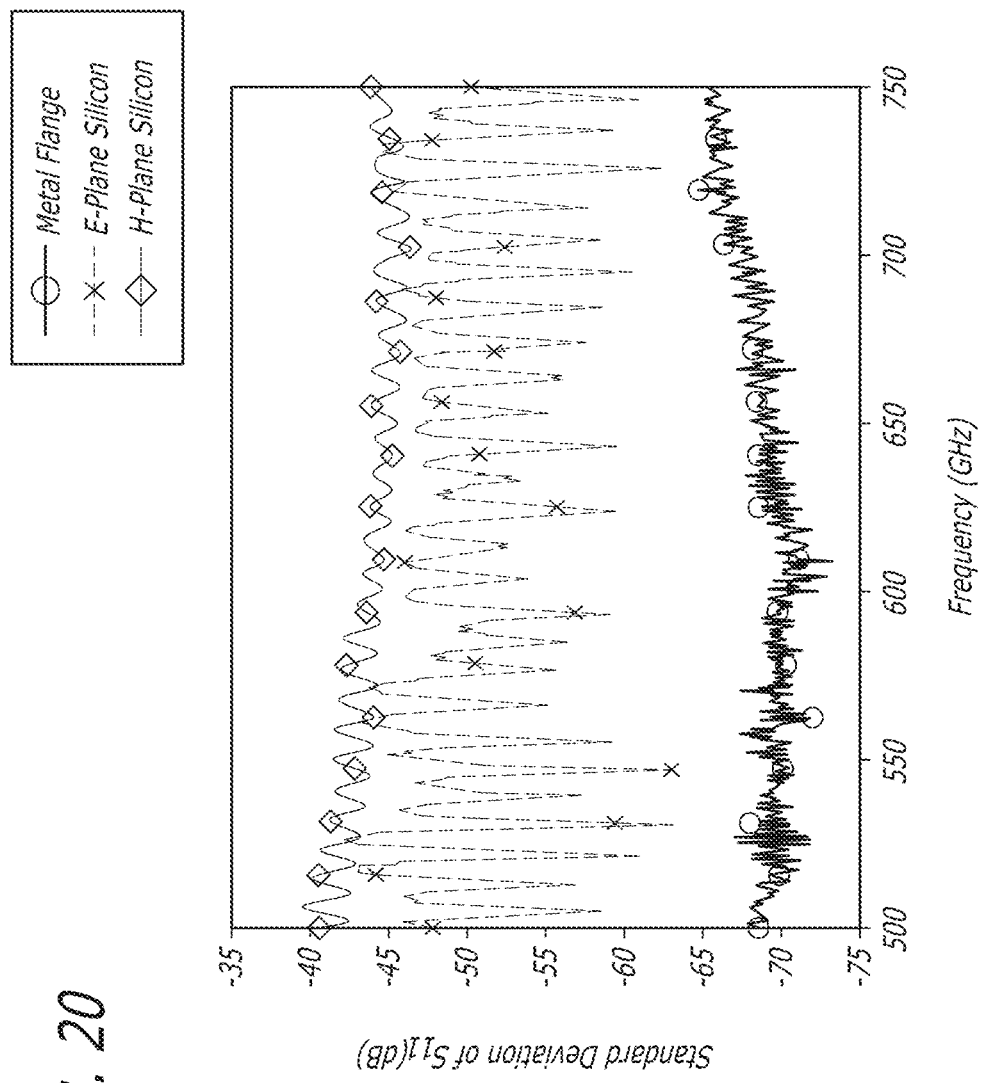
FIG. 20 is a graph showing a comparison of the repeatability of the silicon boss alignment to that of the UG-386 precision flange.

FIG. 20 is a graph showing a comparison of the repeatability of the silicon boss alignment to that of the UG-386 precision flange. FIG. 20 compares the standard deviation of $S_{11}$ of the silicon boss alignment scheme with the precision UG-386 flange standard and the drift of the VNA. This standard deviation is calculated as:

$$20 \log_{10} \sqrt{\frac{1}{n}\sum_{i=1}^{n} |\Gamma_i - \overline{\Gamma}|^2}$$

where, $$\overline{\Gamma} = \frac{1}{n}\left(\sum_{i=1}^{n} Re\{\Gamma\} + j\sum_{i=1}^{n} Im\{\Gamma\}\right)$$

Twelve connect-disconnect cycles were included in this measurement. This formulation of the variation between measurements captures the minimum reflection coefficient that can be measured with this alignment scheme.

FIG. 20 shows that despite the tolerances of the alignment bosses being comparable to that of the metal flange the repeatability is not. There are two possible sources of this reduction in repeatability. The first is that wear of the silicon alignment bosses against the metal pockets could gradually decrease the alignment over multiple connection cycles.

The second source of error is that the angular alignment of the wafer plane to the flange is not controlled well due to the need for contact to be made to the silicon and not the metal flange as seen in FIG. 18C. There is a gap of 125 μm between the silicon and the metal fixture resulting in possible angular misalignment of ±0.8°. The discontinuity created by the gaps between the silicon and metal flange would be affected by this angular variation. This source of error could be improved with longer alignment bosses at the risk of being more fragile or by reducing the gap between the metal fixture and the flange.

Although the silicon boss alignment scheme is 20 dB worse than the metal flange alignment, the 40 dB repeatability this approach provides is sufficient for most measurements at these frequencies. More importantly, this measurement shows that the current approach to measuring from the side of the wafer is limited by the reflections at the interface and not the alignment to the mating metal components.

Quadrature Hybrid Coupler

As a final demonstration that complex waveguide circuits can be fabricated and measured with our silicon micromachining process, a 3 dB quadrature hybrid coupler operating from 500 to 600 GHz is tested. The circuit is a 5 branch Chebyshev design, which is then tuned in HFSS to compensate for the capacitive effects of the T-junctions.

Figure 21:
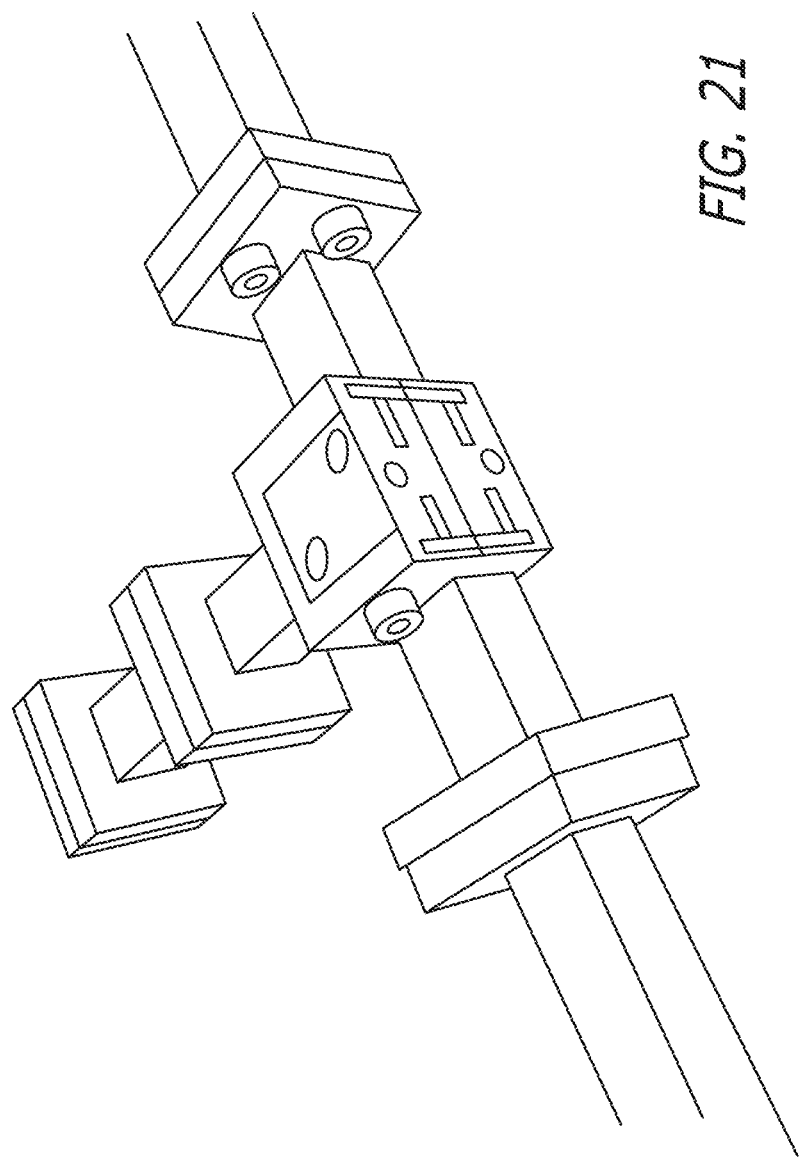
FIG. 21 is an image of the waveguide hybrid measurement apparatus.

As shown in FIG. 21, the coupler is measured with only two-ports at a time, so the other two ports must be matched. To match the isolated port, a waveguide wedge load was inserted into the isolated port. This load is a 5° tapered wedge load ground from Emerson & Cumming Eccosorb MF-116 material. The other uncoupled port is matched with a load provided in the calibration kit of the VNA through one of the silicon mating flanges as shown in FIG. 21.

FIG. 21 is an image of the waveguide hybrid measurement apparatus.

Figure 22A:
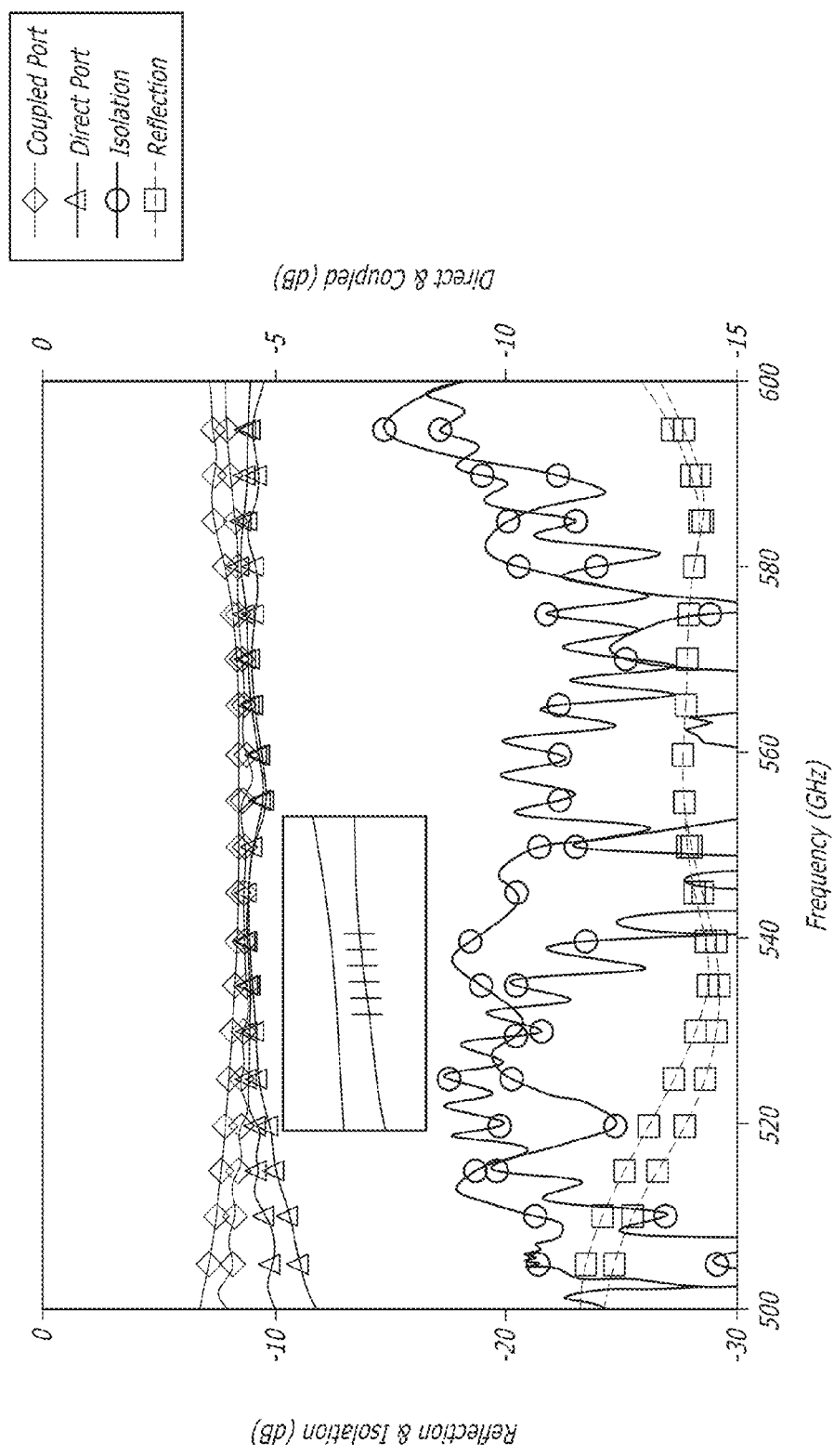
FIG. 22A is a graph of the measured S-parameters as a function of frequency for a 3 dB hybrid coupler.

FIG. 22A is a graph of the measured S-parameters as a function of frequency for a 3 dB hybrid coupler. As seen in FIG. 22A the return loss is less than 20 dB and the amplitude balance is less than 1 dB across designed band. The isolation is measured between the direct and coupled ports since the wedge load is mounted in the isolated port. The minimum isolation is 16 dB, which is limited by the reflection of the wedge load.

Figure 22B:
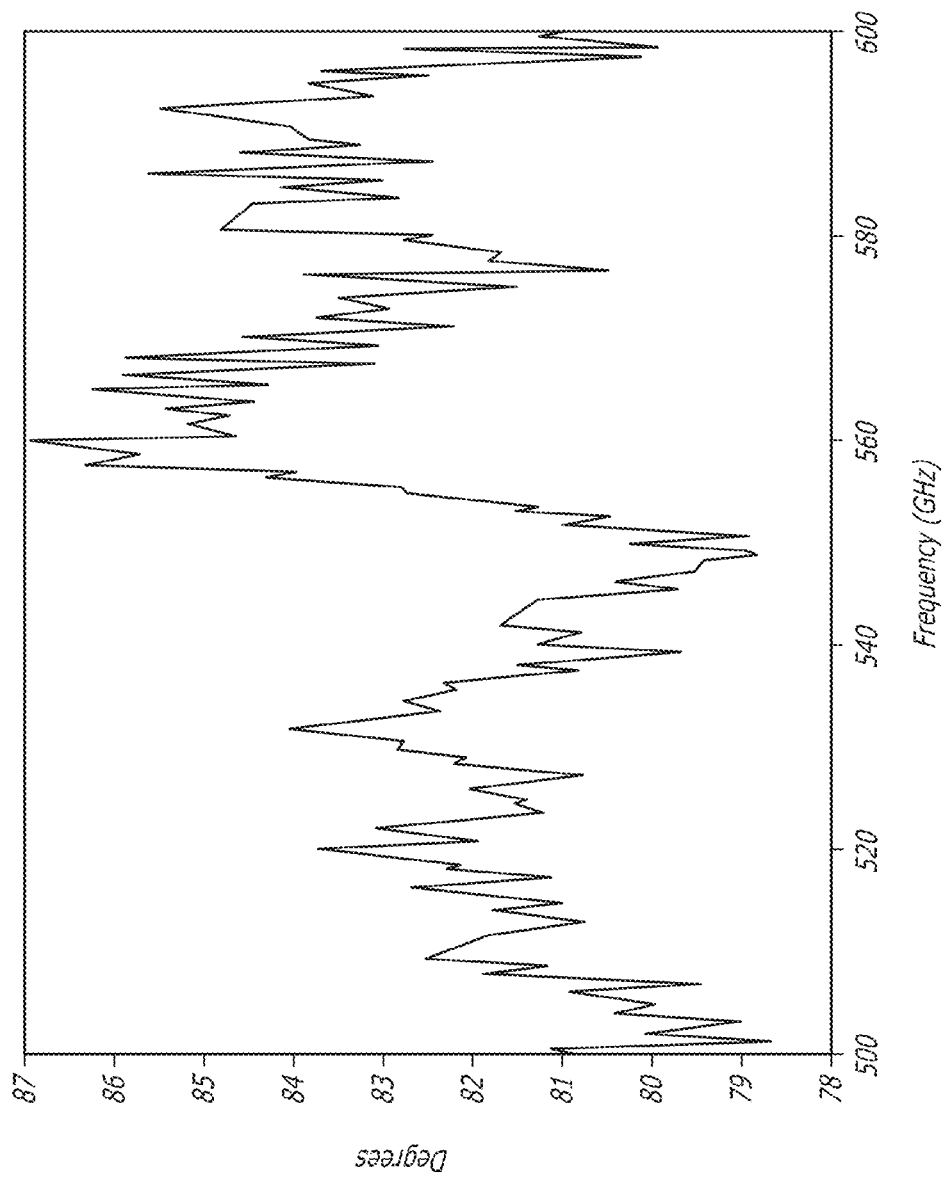
FIG. 22B is a graph of the phase balance a function of frequency between the direct and coupled ports.

FIG. 22B is a graph of the phase balance a function of frequency between the direct and coupled ports, which by design should be 90°±1°. The measured phase imbalance is less than 10° throughout most of the band. This offset from the design is likely due to variations in the silicon surface between the direct and coupled ports, creating different phase shifts through the flange interface.

While the alignment pins described herein have been constructed from silicon, it is believed that other materials of construction could also be used to fabricate such alignment pins. In particular any material that can be fabricated with good surface smoothness, for example having a surface roughness measured in tens of microns, and that can be compressed as described hereinabove can be used.

DEFINITIONS

Unless otherwise explicitly recited herein, any reference to an electronic signal or an electromagnetic signal (or their equivalents) is to be understood as referring to a non-transitory electronic signal or a non-transitory electromagnetic signal.

THEORETICAL DISCUSSION

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A system, comprising:
   a first wafer comprising a first recess;
   a second wafer comprising a second recess in a corresponding position to the first recess to allow alignment of the first and second wafers; and
   an alignment pin configured to align the first and second wafers, the alignment pin having a first end and a second end, the alignment pin including
      a compressible structure having a central axis, said compressible structure having an arcuate surface disposed about said central axis, said compressible structure having an aperture oriented along said central axis defined within said compressible structure, said compressible structure having two opposed projections each oriented in a direction perpendicular to said central axis and having a direction opposite to each other, said compressible structure configured to assume a relaxed configuration in which said two opposed projections are spaced apart when no mechanical force is applied to said two opposed projections and said compressible structure is configured to assume a compressed configuration upon the application of a mechanical force to said two opposed projections,
      wherein the compressible structure has a gap in the arcuate surface where the two opposed projections are located, the gap being between 20 and 200 microns, and
      wherein the compressible structure is configured to be inserted, in the compressed configuration, in part in the first recess and in part in the second recess, thereby aligning the first and second wafers.

2. The system of claim 1, wherein said compressible structure is made of silicon.

3. The system of claim 1, wherein said compressible structure has a length between 20 and 200 microns measured parallel to said central axis.

4. The system of claim 1, wherein said two opposed projections are spaced apart by a distance measured in tens of microns when said mechanical force is not applied to said two opposed projections.

5. The system of claim 1, wherein said first end and said second end each have a dimension d measured along a chord perpendicular to and intersecting said central axis, said chord having two ends, each of the two ends situated on said arcuate surface when said mechanical force is not applied to said two opposed projections and wherein said first end and said second end each have a dimension c smaller than said dimension d measured along a chord perpendicular to and intersecting said central axis, said chord having two ends, each of the two ends situated on said arcuate surface upon the application of mechanical force to said two opposed projections.

6. The system of claim 1, wherein said compressible structure has a thickness between 40 and 100 microns.

7. The system of claim 1, wherein said compressible structure has a thickness of 100 microns.

8. The system of claim 7, wherein said compressible structure has a relaxed diameter of 1.025 mm.

9. The system of claim 1, wherein the first recess and the second recess each comprise a first part configured to accept the arcuate surface of the compressible structure, and a second part configured to accept the two opposed projections of the compressible structure.

10. The system of claim 9, wherein the first part is laterally narrower than the second part.

11. The system of claim 9, wherein the first part has a circular cross-section and the second part has a rectangular cross-section, each of the first and second recesses having a cross-section formed by an intersection of the circular and rectangular cross-sections.

* * * * *